(12) United States Patent
Chang et al.

(10) Patent No.: US 7,514,861 B2
(45) Date of Patent: Apr. 7, 2009

(54) ORGANIC ELECTRO-LUMINESCENT DEVICE

(75) Inventors: Chan-Ching Chang, Taoyuan County (TW); Hsiao-Wen Huang, Tainan County (TW); Chin-Hsin Chen, Taipei (TW); Shuenn-Jiun Tang, Hsinchu County (TW); Chun-Chung Lu, Taichung County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 504 days.

(21) Appl. No.: 11/164,484

(22) Filed: Nov. 24, 2005

(65) Prior Publication Data

US 2007/0114916 A1    May 24, 2007

(51) Int. Cl.
*H01J 1/62* (2006.01)
(52) U.S. Cl. .................................................. 313/504
(58) Field of Classification Search ................. 313/498, 313/504, 506
See application file for complete search history.

(56) References Cited

U.S. PATENT DOCUMENTS

| 6,337,492 | B1 | 1/2002 | Jones et al. | |
| 6,891,326 | B2 * | 5/2005 | Lu | 313/504 |
| 7,126,267 | B2 * | 10/2006 | Liao et al. | 313/500 |

FOREIGN PATENT DOCUMENTS

| EP | 0987774 | 3/2000 |
| TW | 595260 | 6/2004 |

* cited by examiner

*Primary Examiner*—Vip Patel
(74) *Attorney, Agent, or Firm*—Jianq Chyun IP Office

(57) ABSTRACT

An organic electro-luminescent device including a substrate, a plurality of organic electro-luminescent units and a reflective electrode layer is provided. The organic electro-luminescent units are stacked on the substrate, and the reflective electrode layer is disposed between the adjacent organic electro-luminescent units. As mentioned above, the organic electro-luminescent device can provide double-sided display function.

12 Claims, 3 Drawing Sheets

ORGANIC ELECTRO-LUMINESCENT DEVICE

BACKGROUND OF THE INVENTION

1. Field of Invention

The present invention relates to a luminescent device, and particularly to an organic electro-luminescent device.

2. Description of the Related Art

Organic electro-luminescent device (OELD) is a component using the self-luminescent characteristic of the organic functional material to reach the display effects, wherein the organic functional material is divided into two types including small molecule OELD (SM-OELD) and polymer electro-luminescent device (PELD) according to its the molecular weight. The luminescent structures of both are comprised with a couple of electrodes and an organic functional layer. The structure related to the conventional organic electro-luminescent device is described as follows.

FIG. 1 is a schematic diagram illustrating the structure of conventional organic electro-luminescent device. Referring to FIG. 1, the conventional organic electro-luminescent device 100 comprises a substrate 110, an anode layer 120, an organic functional layer 130, and a cathode layer 140, wherein the anode layer 120 is disposed on the substrate 110 and the material of the anode layer 120 is indium tin oxide (ITO). The organic functional layer 130 is disposed on the anode layer 120 and the organic functional layer 130 is usually formed of several layers of organic films. Besides, the cathode layer 140 is disposed on the organic functional layer 130 and the material of the cathode layer 140 is generally metals.

When a DC voltage is applied, the holes are injected from the anode layer 120 into the organic functional layer 130 and the electrons are injected from the cathode layer 140 into the organic functional layer 130. Because of the voltage difference resulted from the applied electric field, the two carriers, holes and electrons, move in the organic functional layer 130 and produce radiative recombination. A part of the energy released by the recombination of the holes and electrons can excite the molecules of the organic luminescent material into single excited state molecules. When the single excited state molecules release energy and come back to the ground state, a portion of energy is released to luminesce as photons. The above-mentioned description is the luminescent theorem of the conventional organic electro-luminescent device 100.

However, the problem existed in the conventional organic electro-luminescent device 100 is that the light emitted by the organic functional layer 130 usually causes reflection or refraction because of the difference of the refractive index in each layer of the device. Therefore, most of the light emitted from the organic functional layer 130 is constrained within the device and not be able to pass through the substrate 110 so that the efficiency of luminescence of the organic electro-luminescent device 100 is decreased. In addition, the conventional organic electro-luminescent device 100 can only luminese on single side instead of double sides.

SUMMARY OF THE INVENTION

Accordingly, an object of the present invention is to provide a organic electro-luminescent device to offer a function of double-sided luminance.

Based on the foregoing or other objects, the invention provides a organic electro-luminescent device which comprises a transparent substrate, a plurality of organic electro-luminescent units and a reflective electrode layer. Wherein, the organic electro-luminescent units are stacked on the transparent substrate and the reflective electrode layer are placed between two adjacent organic electro-luminescent units.

According to the organic electro-luminescent device in an embodiment of the present invention, the material of the reflective electrode layer can be selected from one of the groups combined by aluminum, calcium, magnesium, indium, tin, manganese, silver, gold, and alloys thereof.

According to the organic electro-luminescent device in an embodiment of the present invention, the organic electro-luminescent device further comprises a first doping layer and a second doping layer, wherein the reflective electrode layer is disposed between the first doping layer and the second doping layer.

According to the organic electro-luminescent device in an embodiment of the present invention, each of the organic electro-luminescent units comprises an anode layer, a cathode layer and an organic functional layer disposed between the anode layer and the cathode layer.

According to the organic electro-luminescent device in an embodiment of the present invention, the organic electro-luminescent unit mostly close to the surface of the substrate comprises an anode layer and an organic functional layer, wherein the anode layer is disposed on the substrate. The organic functional layer is disposed on the anode layer and the reflective electrode layer disposed on the organic functional layer of the organic electro-luminescent unit is used as a cathode layer. In addition, the anode layer is a transparent conductive layer and the transparent conductive layer is formed of the materials such as indium tin oxide (ITO), indium zinc oxide (IZO), and aluminum zinc oxide (AZO).

According to the organic electro-luminescent device in an embodiment of the present invention, the organic electro-luminescent unit mostly far away from the surface of the substrate comprises a cathode layer and an organic functional layer. The organic functional layer is disposed under the cathode layer and the reflective electrode layer disposed under the organic functional layer of the organic electro-luminescent unit is used as an anode layer. Besides, the cathode layer is formed of the materials such as aluminum, calcium, magnesium, indium, tin, manganese, silver, gold, and other alloys. Moreover, the cathode layer can be, for example, a transparent conductive layer, wherein the material of the transparent conductive layer can be, for example, indium tin oxide (ITO), indium zinc oxide (IZO), and aluminum zinc oxide (AZO).

According to the organic electro-luminescent device in an embodiment of the present invention, the organic electro-luminescent unit mostly close to the surface of the substrate comprises an anode layer and a organic functional layer, wherein the anode layer is disposed on the substrate. The organic functional layer is disposed on the anode layer and the reflective electrode layer disposed on the organic functional layer of the organic electro-luminescent unit is used as a cathode layer. In addition, the organic electro-luminescent unit mostly far away from the surface of the substrate comprises a cathode layer and an organic functional layer. The organic functional layer is disposed under the cathode layer and the reflective electrode layer disposed under the organic functional layer of the organic electro-luminescent unit is used as an anode layer.

According to the organic electro-luminescent device in an embodiment of the present invention, the substrate can be, for example, a glass substrate, a plastic substrate, or a flexible substrate.

As mentioned above, the invention adopts a reflective electrode layer to connect with two adjacent organic electroluminescent units or two adjacent organic functional layer, so as to emit light with different colors from double sides. Therefore, the organic electro-luminescent device in the present invention can provide with double-sided display function.

BRIEF DESCRIPTION OF THE DRAWINGS

The accompanying drawings are included to provide a further understanding of the present invention, and are incorporated in and constitute a part of this specification. The drawings illustrate embodiments of the present invention and, together with the description, serve for explaining the principles of the present invention.

DESCRIPTION OF THE EMBODIMENTS

Figure 1:
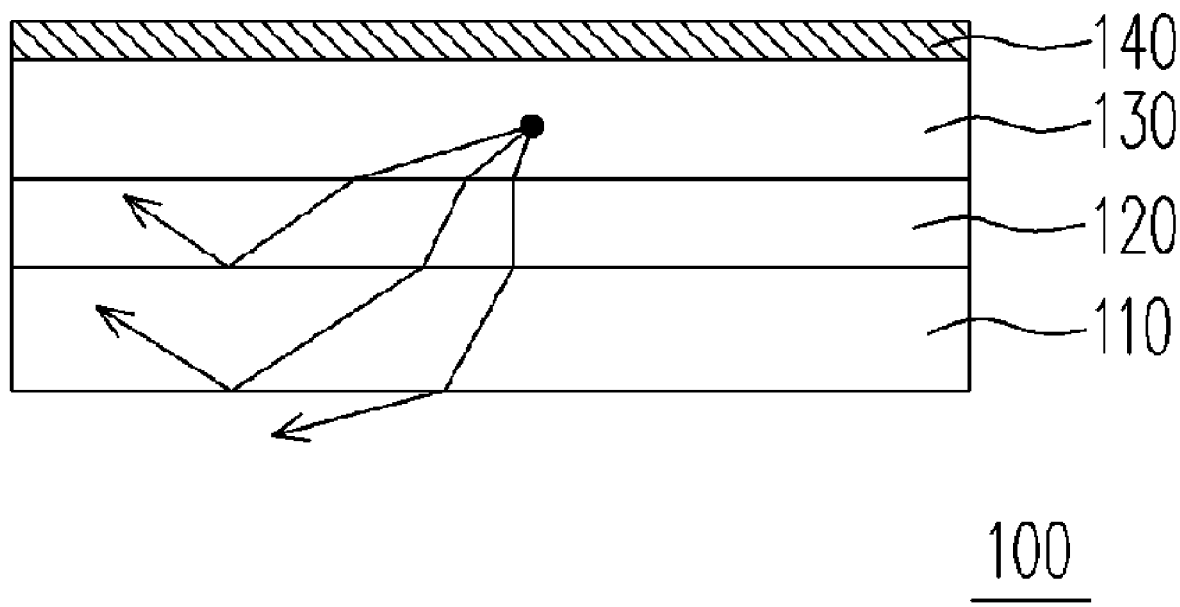
FIG. 1 is a schematic diagram illustrating the structure of conventional organic electro-luminescent device.
Figure 2:
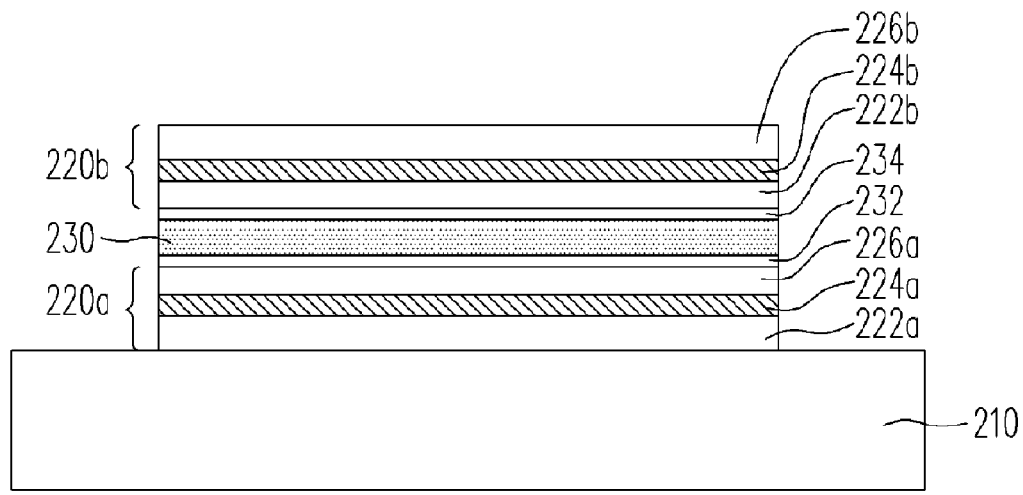
FIG. 2 is a cross-sectional diagram of the organic electro-luminescent device according to the first embodiment of the present invention.

FIG. 2 is a cross-sectional diagram of the organic electro-luminescent device according to the first embodiment of the present invention. Referring to FIG. 2, the organic electro-luminescent device 200 of the present embodiment comprises a substrate 210, a plurality of organic electro-luminescent units 220a and 220b, and a reflective electrode layer 230, wherein the organic electro-luminescent unit 220a and 220b are stacked on the substrate 210 and the reflective electrode layer 230 is disposed between the organic electro-luminescent unit 220a and 220b. Besides, the substrate 210 can be a glass substrate, a quartz substrate, a plastic substrate, or a flexible substrate. In the present embodiment, the organic electro-luminescent device 200 further comprises a first doping layer 232 and a second doping layer 234, wherein the reflective electrode layer 230 is disposed between the first doping layer 232 and the second doping layer 234. For example, the first doping layer 232 can be a n-type doping layer and the second doping layer 234 can be a p-type doping layer.

In detail, the organic electro-luminescent unit 220a comprises an anode layer 222a, a cathode layer 226a, and an organic functional layer 224a disposed between the anode layer 222a and the cathode layer 226a. In addition, except for the primary organic luminescent layer, the organic functional layer 224a further comprises a hole injecting layer, a hole transmitting layer, an electron transmitting layer, an electron injecting layer, or other combined layer according to the practical need for each device.

Accordingly, the organic electro-luminescent unit 220b comprises an anode layer 222b, a cathode layer 226b, and an organic functional layer 224b disposed between the anode layer 222b and the cathode layer 226b. Besides, the structure of the organic functional layer 224b is similar to the one of the organic functional layer 224a. Except for the primary organic luminescent layer, the organic functional layer 224b further comprises a hole injecting layer, a hole transmitting layer, an electron transmitting layer, an electron injecting layer, or other combined layer according to the practical need for each device.

Accordingly, the anode layer 222a and 222b can be transparent or opaque. Besides, the anode layer 222a and 222b can be a transparent conductive layer and the transparent conductive layer is formed of materials such as indium tin oxide (ITO), indium zinc oxide (IZO), aluminum zinc oxide (AZO), or other kinds of transparent metal oxide. When the material of the anode layer 222a is formed of indium tin oxide (ITO), indium zinc oxide (IZO), aluminum zinc oxide (AZO), or other kinds of transparent metal oxide, the method for forming the anode layer 222a can be evaporation or sputtering. In addition, the material of the cathode layer 226a and 226b can be transparent or opaque, and the material of the cathode layer 226a and 226b can be aluminum, calcium, magnesium, indium, tin, manganese, silver, gold, and other alloys, wherein the alloys containing magnesium can be magnesium-silver alloy, magnesium-indium alloy, magnesium-tin alloy, magnesium-antimony alloy, or magnesium-tellurium alloy.

Referring to FIG. 2, the reflective electrode layer 230 can be formed by evaporation, wherein the reflective electrode layer 230 can be formed of aluminum or other kinds of metals. The thickness of the reflective electrode layer 230 can be 1000 angstrom or other sizes of thicknesses that can cover the light. The reflective electrode layer 230 is not only used as the interconnecting layer connecting the two organic electro-luminescent units 220a and 220b, but makes the light emitted from the two organic electro-luminescent units 220a and 220b be emitted from two corresponding surfaces of the organic electro-luminescent device 200, respectively. In other words, the organic electro-luminescent device 200 in present embodiment can emit light with two kinds of different colors, so as to achieve the double-side display function.

Accordingly, the organic electro-luminescent device 200 in the present embodiment is not only limited to only comprising two organic electro-luminescent units 220a and 220b, it can further comprise more than two organic electro-luminescent units. Besides, the material of the organic electro-luminescent units and the organic functional layer can be the same or not the same. In other words, the light emitted from the organic electro-luminescent units can be in the same or different colors.

Figure 3:
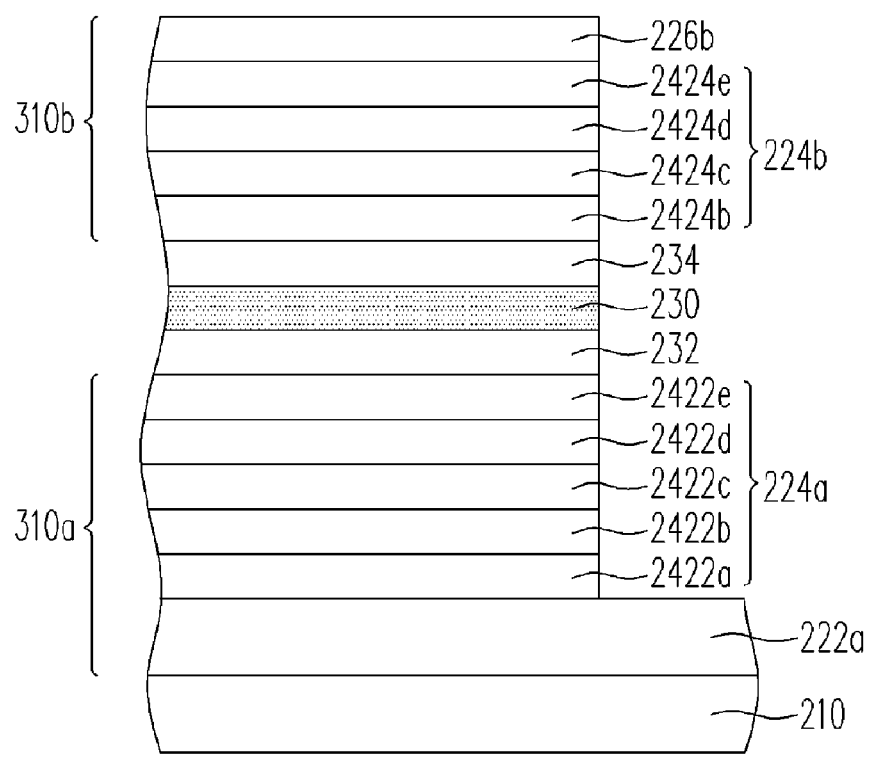
FIG. 3 is a cross-sectional diagram of the organic electro-luminescent device according to the second embodiment of the present invention.

FIG. 3 is a cross-sectional diagram of the organic electro-luminescent device according to the second embodiment of the present invention. Referring to FIG. 3, the second embodiment is similar to the first one, wherein the difference in between is that in the organic electro-luminescent device 300 of the present embodiment, the reflective electrode layer 230 is used as a common electrode layer. In other words, the reflective electrode layer 230 is disposed between the two adjacent organic functional layer 224a and 224b. Accordingly, the reflective electrode layer 230 can be formed by evaporation. Therefore, the organic functional layer 224a is not damaged in the process of forming the reflective electrode layer 230.

In detail, the reflective electrode layer 230, the organic functional layer 224a, and the anode layer 222a form an organic electro-luminescent unit 310a. Therefore, the reflective electrode layer 230 is used as a cathode layer of the organic electro-luminescent unit 310a. Accordingly, the reflective electrode layer 230, the organic functional layer 224b, and the anode layer 222b form another organic electro-luminescent unit 310b. Therefore, the reflective electrode layer 230 is also used as an anode layer of the organic electro-luminescent unit 310b.

The organic functional layer 224a includes a hole injecting layer 2422a, a hole transmitting layer 2422b, an organic luminescent layer 2422c, a electron transmitting layer 2422d, and an electron injecting layer 2422e. The organic functional layer 224b includes a hole injecting layer 2424a, a hole transmitting layer 2424b, an organic luminescent layer 2424c, a electron transmitting layer 2424d, and an electron injecting layer 2424e. In addition, the material of the hole injecting layer 2422a can be copper phthalocyanine (CuPc) and the thickness of the hole injecting layer 2422a is about 150 angstrom. The material of the hole transmitting layer 2422b and 2424b can be α-naphylhenyidiamine (NPB) and the thicknesses of the hole transmitting layer 2422b and 2424b are about 700 angstrom and 600 angstrom, respectively.

The material of the organic luminescent layer 2422c can be MADN and dopant DSA-Ph, the ratio of the volume for DSA-Ph to MADN is about 3%, and the thickness of the organic luminescent layer 2422c is about 400 angstrom. Besides, the material of the organic luminescent layer 2422c can be Alq3 and dopant Ruthenium (Ru), the ratio of the volume for Alq3 to Ru is about 4%, and the thickness of the organic luminescent layer 2422c is about 375 angstrom.

The material of the electron transmitting layer 2422d and 2424d can be Alq3, and the thicknesses of the electron transmitting layer 2422d and 2424d are about 100 angstrom and 375 angstrom. In addition, the material of the electron injecting layer 2422e can be Magnesium (Mg) and Alq3, the the ratio of the volume for Mg to Alq3 is about 1 to 1, and the thickness of the electron injecting layer 2422e is about 100 angstrom. Moreover, the material of the electron injecting layer 2424e can be $WO_3$ and NPB, the the ratio of the volume for $WO_3$ to NPB is about 3 to 1, and the thickness of the electron injecting layer 2424e is about 200 angstrom. Furthermore, the thickness of the cathode layer 226b is about 400 angstrom. In the present embodiment, the first doping layer 232 can be a n-type doping layer and the second doping layer 234 can be a p-type doping layer.

In the above-mentioned first embodiment and second embodiment, each of the films formed after the anode layer 222a is made through the same manufacturing process such as evaporation. Therefore, the present invention not only shortens the manufacturing time, but also forms each of the films consecutively after the anode layer 222a.

Figure 4:
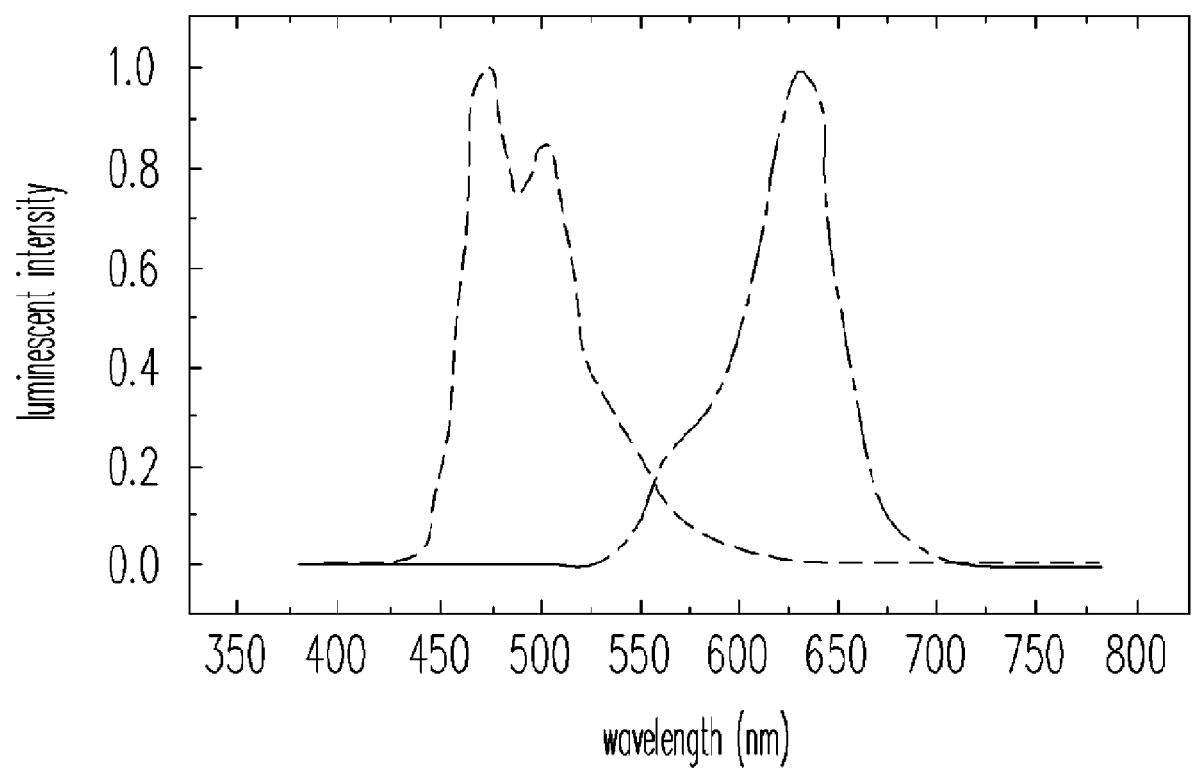
FIG. 4 is an optical characteristic diagram of the organic electro-luminescent device according to the second embodiment of the present invention.

FIG. 4 is an optical characteristic diagram of the organic electro-luminescent device according to the second embodiment of the present invention. Referring to FIG. 4, the horizontal coordinate is wavelength and the vertical coordinate is luminescent intensity. It can be known from FIG. 4 that the maximum peak values of the organic electro-luminescent device 300 in the present embodiment are 486 angstrom and 628 angstrom, respectively. Therefore, the present invention can display different information on both sides.

To sum up, in the organic electro-luminescent device of the present invention, a reflective electrode layer is adopted as an interconnecting layer to connect two adjacent organic electro-luminescent units, two adjacent organic functional layers, or adjacent organic electro-luminescent unit and organic functional layer. Compared to the convention, the organic electro-luminescent device in the present invention includes function of double-sided display such that it can display different colors on both sides. Because of the double-sided display function, the organic electro-luminescent device in the present invention can be used to double-sided display mobile phones, televisions, or screens.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. An organic electroluminescent device, comprising:
   a transparent substrate;
   a plurality of organic electro-luminescent units stacked on the substrate, wherein each of the organic electro-luminescent units comprises an anode layer, a cathode layer and an organic functional layer disposed between the anode layer and the cathode layer; and
   a reflective electrode layer placed between adjacent two of the organic electro-luminescent units.

2. The organic electro-luminescent device of claim 1, wherein the material of the reflective electrode layer is selected from one of the groups combined by aluminum, calcium, magnesium, indium, tin, manganese, silver, gold, and alloys thereof.

3. The organic electro-luminescent device of claim 1, further comprising a first doping layer and a second doping layer, wherein the reflective electrode layer is disposed between the first doping layer and the second doping layer.

4. The organic electro-luminescent device of claim 1, wherein the reflective electrode layer disposed on the organic functional layer of the organic electro-luminescent unit mostly close to the surface of the transparent substrate is used as the cathode layer.

5. The organic electro-luminescent device of claim 4, wherein the anode layer of the organic electro-luminescent unit mostly close to the surface of the transparent substrate is a transparent conductive layer.

6. The organic electro-luminescent device of claim 5, wherein the material of the transparent conductive layer includes indium tin oxide (ITO), indium zinc oxide (IZO), and aluminum zinc oxide (AZO).

7. The organic electro-luminescent device of claim 1, wherein the reflective electrode layer disposed under the organic functional layer of the organic electro-luminescent unit mostly far away from the surface of the transparent substrate is used as the anode layer.

8. The organic electro-luminescent device of claim 7, wherein the material of the cathode layer of the organic electro-lumninescent unit mostly far away from the surface of the transparent substrate is selected from one of the groups combined by aluminum, calcium, magnesium, indium, tin, manganese, silver, gold, and alloys thereof.

9. The organic electro-luminescent device of claim 7, wherein the cathode layer is a transparent conductive layer.

10. The organic electro-luminescent device of claim 9, wherein the material of the transparent conductive layer includes indium tin oxide (ITO), indium zinc oxide (IZO), and aluminum zinc oxide (AZO).

11. The organic electro-luminescent device of claim 1, wherein the organic electro-luminescent unit mostly close to the surface of the substrate comprises the anode layer disposed on the transparent substrate and the organic functional layer disposed on the anode layer, wherein the reflective electrode layer disposed on the organic functional layer of the organic electro-luminescent unit mostly close to the surface of the substrate is used as the cathode layer; the organic electroluminescent unit mostly far away from the surface of the transparent substrate comprises the cathode layer and the organic functional layer disposed under the cathode layer, wherein the reflective electrode layer disposed under the organic functional layer of the organic electro-luminescent unit mostly far away from the surface of the transparent substrate is used as the anode layer.

12. The organic electro-luminescent device of claim 1, wherein the transparent substrate includes a glass substrate, a plastic substrate, or a flexible substrate.

* * * * *